Jan. 20, 1970 L. A. GOSHORN 3,491,267

PRINTED CIRCUIT BOARD WITH ELEVATED BUS BARS

Filed Jan. 30, 1968 2 Sheets-Sheet 1

INVENTOR.
LAWRENCE A. GOSHORN
BY Haelmer & Worrel
ATTORNEYS.

Jan. 20, 1970 L. A. GOSHORN 3,491,267

PRINTED CIRCUIT BOARD WITH ELEVATED BUS BARS

Filed Jan. 30, 1968 2 Sheets-Sheet 2

INVENTOR.
LAWRENCE A. GOSHORN
BY Huebner & Worrel
ATTORNEYS.

United States Patent Office 3,491,267

Patented Jan. 20, 1970

3,491,267

PRINTED CIRCUIT BOARD WITH ELEVATED BUS BARS

Lawrence A. Goshorn, Villa Park, Calif., assignor to General Automation, Inc., Orange, Calif., a corporation of California Filed Jan. 30, 1968, Ser. No. 701,630

Int. Cl. H05k *1/18, 3/32*

U.S. Cl. 317—101 9 Claims

ABSTRACT OF THE DISCLOSURE

A printed circuit board or card wherein power or signal bussing is accomplished by means of bus bars which are elevated from the board and run parallel to the plane of the board. A preferred form of the bus bars is flat strips oriented with their planes normal to the plane of the board, the strips having connector tabs extending from their lower edges to provide both mechanical and electrical connection with the board. The bus bars may be provided either in a single layer or in several overlapping layers having different elevations.

BACKGROUND OF THE INVENTION

Power and signal bussing has become increasingly more cumbersome and difficult with the greatly increasing number and density of circuit components and conductors employed on modern printed circuit boards. This problem of bussing has become particularly critical with the advent of integrated circuit logic. It is not unusual today to have a printed circuit board only about 12" by 17" in size which embodies between about 160 and 200 integrated circuits, as well as some other separate circuit components, and a vast number of etch conductors on the board which is required to accommodate this large number of integrated circuits.

A major problem in power and signal bussing in such printed circuit boards is that many of the etch conductors on the board act as fences or barriers preventing bus bars from being etched onto the same surface of the board, and thereby requiring that bus conductors be broken into small segments. As a practical matter, when printed circuit boards have become highly complex, as where they embody a number of integrated circuit units, it has frequently been necessary to provide a laminar circuit board of multiple layers in order to provide adequate bussing and component interconnect. This is a very expensive answer to the problem, and it is also undesirable as it adds considerable weight to the board.

The conventional practice of bussing by etch conductors in printed circuit boards has encountered a further difficulty in boards embodying integrated circuits, in that the integrated circuit logic has been found to produce a significant amount of electrical noise in the conventional etch power busses. The generally close proximity of the etch bus conductors to other conductors and circuit components on the board is one factor in the production of such noise. Another factor is the relatively thin nature of the etch type power busses. Since such noise is generally inversely proportional to the amount of copper in the bus conductors, the noise can be reduced by providing a thicker etch for the bus conductors. However, this then requires that all of the etch conductors be thicker than desired, and objectionably adds to the weight of the board.

In general, because etch conductors are thin, it is difficult to obtain adequate current carrying capacity for power bussing with etch bus lines where a printed circuit board embodies a large number of circuit components and conductors.

This noise problem in printed circuit boards of the type embodying integrated circuits has, prior to the present invention, required the addition of separate capacitors associated with the integrated circuit units to reduce the noise to a level which can be tolerated. In many circuits such an additional capacitor will be required in association with each of the integrated circuit units, while in other circuits one such additional capacitor may suffice for every three or four integrated circuit units. It will thus be seen that where the printed circuit board embodies in the range of between about 160 and 200 integrated circuit units, a large number of these additional capacitors are required.

Still another problem in connection with conventional printed circuit boards is that they are relatively thin, as for example .067 inch or .093 inch, and when they embody a large number of circuit components and conductors there is frequently a serious problem of warpage. Typically, a printed circuit board will only be supported along either two or three of its edges, which makes the central portion of the board and any unsupported edges vulnerable to sag. This can bring a portion of the board undesirably close to another board or associated equipment and thereby disturb the functioning of the elements on the board.

SUMMARY OF THE INVENTION

In view of these and other problems in the art, it is an object of the present invention to provide a printed circuit board or card having elevated bus bars which are spaced from the board and from the etch conductors on the board and which extend generally parallel to the plane of the board.

Another object of the invention is to provide a printed circuit board of the character described having elevated bus bars, wherein the bus bars are in the form of elongated, flat strips which are oriented with their planes normal to the plane of the board, these flat strips having connector tabs extending toward the board from the edges of the strips that are closest to the board so as to provide both mechanical and electrical connection with the board.

Another object of the invention is to provide a printed circuit board of the character described wherein a plurality of the elevated bus bars are arranged over the board generally in the form of a grid, the bus bars being parallel to each other and adjacent bus bars providing, in effect, connector strips for opposed power or signal connections of a row of circuit components extending between the adjacent bus bars. For example, such a grid may be provided by five parallel elevated bus bars extending across the printed circuit board, with four rows of circuit components, such as integrated circuit units, resistors, capacitors or other components, extending between the adjacent pairs of elevated bus bars. By connecting the first, third and fifth bars to power, and the second and fourth bars to ground, each row of circuit components then lies between a power bus and a ground bus, for convenient connection of all circuit components on the board to power and ground.

Another object of the nvention is to provide a printed circuit board of the character described with elevated bus bars wherein a plurality of overlapping layers of the bus bars are provided by arranging some of the bus bars relatively closely spaced above the printed circuit board, and others of the bus bars spaced a greater distance from the board. By this means, different layers may be employed for different distribution purposes, and if desired, the bus bars of the upper layer may be arranged to cross over the bars of the lower layer without contact or material electrical interference between the layers. An example of such a multi-layer bus bar arrangement which has proved useful is where the lower layer is in the form of a grid of parallel bus bars to provide power of a first voltage to the circuit components, while the upper layer of bus bars is arranged also as a grid of parallel bars, but oriented at right angles to the bars of the lower layer, to provide power of a second voltage to the circuit components.

The elevated bus bars of the present invention provide a number of surprising and unexpected new functions and results over conventional bus conductors employed in printed circuit boards. Thus, for example, the elevated bus bars of the present invention provide a third structural dimension to printed circuit boards, giving them excellent structural rigidity and eliminating the problem of warpage.

The elevated bus bars greatly simplify bussing in complicated printed circuit boards, and consequently reduce the expense and amount of labor involved in assembling printed circuit boards. Thus, the elevated bus bars will normally eliminate the need of a second circuit board lamination which was frequently heretofore required for bussing, and the entire printed circuit board can be covered by a very few elevated bus bars extending substantially the length or width of the board, instead of requiring a large number of power or signal conductors extending in a variety of different directions at various places on the board. Thereby, serious difficulties attending multi-layer boards are eliminated, such as the lamination process, inaccessibility for repair or inspection, and others.

The elevated spacing of the bus bars of the present invention separates the bus bars sufficiently from the noise-producing circuitry on the board to substantially eliminate the heretofore difficult problem of noise pickup in the power busses. Additionally, since the busses are not part of the etch circuitry on the board, they can be provided with as much copper as desired without requiring that all of the etch conductors on the board be thick. This allows the bus bars to be made with optimum current-carrying characteristics, and since the noise induced in such a conductor is generally inversely proportional to the size of the conductor, the heavy copper which can be provided in the bus bars cooperates with the spacing of the bars from the printed circuit conductors to further reduce the noise problem. In fact, with the elevated bus bars of the present invention, the noise problem is substantially completely eliminated, and the separate noise-reducing capacitors heretofore required with integrated circuits are not needed where the bus bars of the present invention are used.

Provision of the elevated bus bars in the form of elongated, flat strips oriented with their planes normal to the plane of the board provides further important and surprising functions and results. For one thing, it provides substantial depth to the added structure of the bus bars, with a minimum of added weight, thereby producing a maximum structural rigidity with a minimum of added weight. Also, since electric current flows primarily proximate the surface of a conductor, the flat strips have optimum current-carrying qualities with a minimum of material. The current density is correspondingly low in the flat bus bar conductors, thereby further assisting in the reduction of noise, and since most of the current-carrying surface areas of the bus bars are spaced even further from the board than the near edges of the bars, the noise pickup is even further reduced.

Another surprising advantage of the flat bus bars is the fact that the connector tabs can be easily formed thereon, as by stamping, without requiring that additional connector elements be soldered or otherwise secured to the bus bars.

A still further surprising new function of the elevated bus bars of the present invention is that where the bars are arranged parallel to each other, and are in the preferred form of flat, elongated strips oriented with their planes normal to the plane of the board, they provide a vaned air flow pattern for guiding cooling air in a predictable pattern over the board.

Further objects and advantages of the present invention will appear during the course of the following part of the specification, wherein the details of construction and mode of operation of a presently preferred embodiment are described with reference to the accompanying drawings, in which:

DETAILED DESCRIPTION

Figures 1, 2, 3, 4, 5:
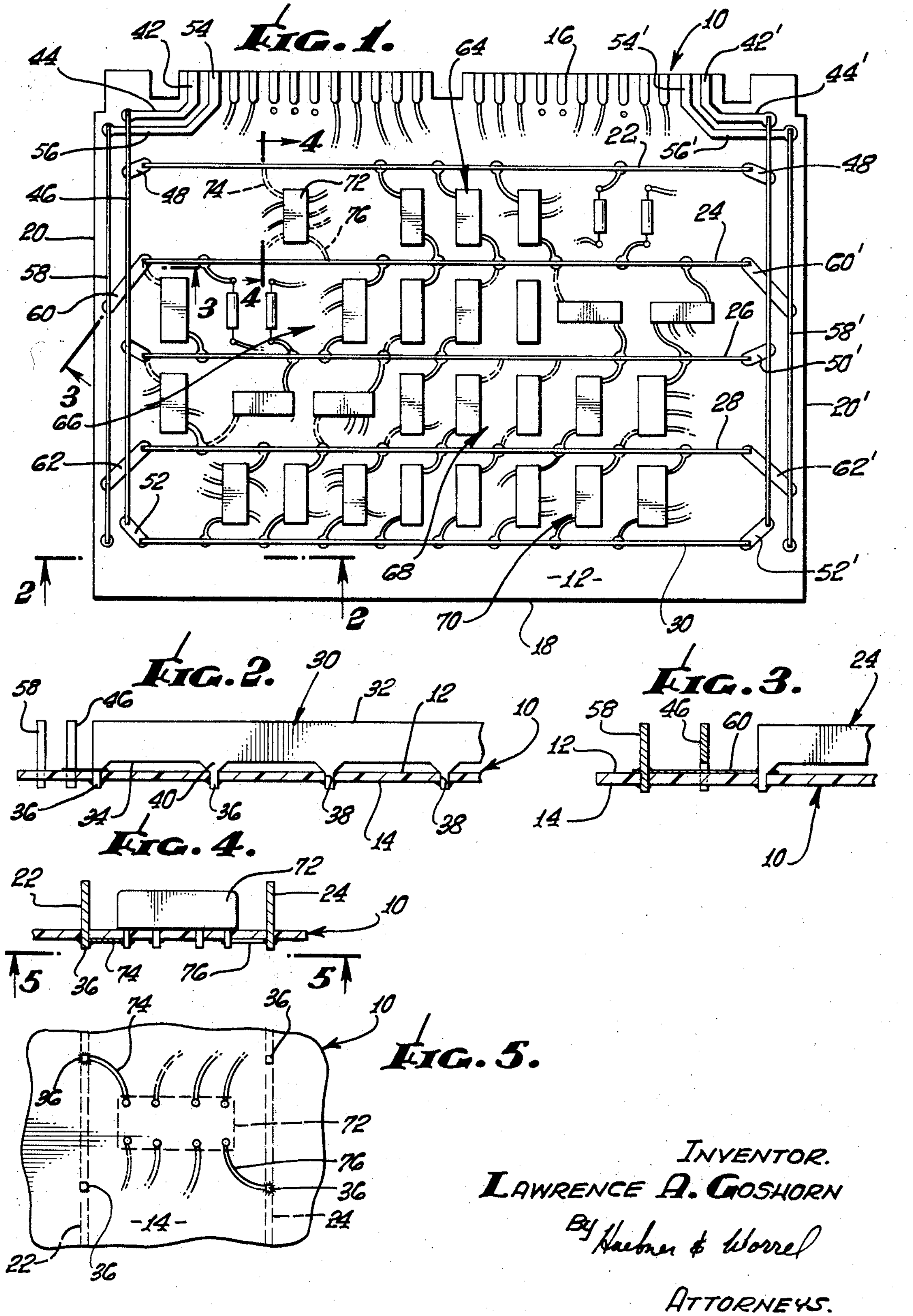
FIGURE 1 is a plan view of the component side of a printed circuit board embodying elevated bus bars in accordance with the present invention.
FIGURE 2 is an enlarged, fragmentary sectional view taken on the line 2—2 in FIGURE 1.
FIGURE 3 is an enlarged, fragmentary sectional view taken on the line 3—3 in FIGURE 1.
FIGURE 4 is an enlarged, fragmentary sectional view taken on the line 4—4 in FIGURE 1.
FIGURE 5 is a fragmentary plan view of the solder side of the board, as viewed along the line 5—5 in FIGURE 4.

Referring to the drawings, and at first to FIGURES 1 to 5 thereof, the invention is illustrated in connection with a printed circuit board 10 having a generally flat component side 12 and opposite solder side 14. The board 10 is generally rectangular in shape, having a connector edge 16, which in this case is one of the long edges of the rectangle, an opposite, outer edge 18, and a pair of side edges 20 and 20'. The printed circuit board 10 is a relatively thin sheet of insulating material, as for example, an epoxy resin-fiberglass combination, which is laminated on both the component and solder sides with layers of a metal which is a good electrical conductor, such as a suitable copper alloy, and then etched by conventional means to leave portions of the conductor laminations thereon as printed circuitry. By way of example only, and not of limitation, typical printed circuit boards to which the present invention may be applied have a thickness of .067 inch or .093 inch, and a rectangular dimension of about 12" by 17". Printed circuit boards of comparable dimensions which are not equipped with the elevated bus bars of the present invention involve a very serious problem of warpage.

The printed circuit board or card 10 is provided with five primary bus bars 22, 24, 26, 28 and 30, which are disposed on the component side of the board in regularly spaced relationship, parallel to each other and to the edges 16 and 18 of the board. Although five of these primary bus bars are shown, it is to be understood that any number may be employed. While it is preferred that these primary bus bars be parallel so that the components can be conveniently arranged in rows between adjacent bus bars, and to function as cooling vanes if desired, it is to be understood that other configurations of the elongated bus bars may be employed if desired. Further, while these primary bus bars 22, 24, 26, 28 and 30 have been shown on the component side of the board, which is usually desirable from a convenience standpoint and also for economy of space since the bus bars 22, 24, 26, 28 and 30 do not add any great amount of thickness to the assembled board, nevertheless, it may in some instances be desirable to mount the primary bus bars on the solder side 14 of the board, which is contemplated to be within the scope of the invention.

As best illustrated in FIGURE 2, each of the bus bars comprises an elongated, flat sheet of conducting material, preferably a suitable copper alloy or other good electrically conducting metal, having generally straight, parallel upper and lower edges 32 and 34, respectively, with a plurality of integral tabs 36 extending downwardly from the lower edge 34 in the plane of the bus bar and engaged in complementary apertures 38 which extend through the board 10. The number and spacing of the tabs 36 on each bus bar is optional, and will depend upon the number of etch conductors on the board which are to be electrically connected to the bus bar. Engagement of the tabs 36 in the respective apertures 38 through the board provides a stable mechanical connection between the bus bars and the board, which is secured by a solder connection between the tabs and respective etch conductors of the board, the solder connection of course providing the required reliable electrical connection between the etch conductors and the bus bar.

Each of the integral tabs 36 on the bus bar flare outwardly in an enlarged leg portion 40 adjacent the lower edge 34 of the bus bar to provide a substantially uniform spacing of the lower edge 34 of the bus bar above the printed circuit board 10.

It is preferred that the tabs 36 extend through the apertures 38 somewhat beyond the solder side 14 of the board, so as to obtain optimum solder connections. While the solder will normally only be applied on the solder side 14, it will, by capillary action, pass through the apertures 38 and make effective solder connections between the tabs 36 and etch conductors on the component side of the board. Adequate clearance is provided between the tabs 36 and the walls of the apertures 38 to secure such flow of solder.

The principal use of the elevated bus bars of the present invention is to distribute power to the circuit components on the board, and for this reason the accompanying drawings illustrate the bus bars as power distribution conductors. Nevertheless, the elevated bus bars of the invention may also be employed for other purposes, as for example for signal bussing where a high current signal is to be conducted.

Typically, power will be introduced to the printed circuit board through connector fingers adjacent the ends of the connector edge 16 of the board. For example, the end fingers 42 and 42′ may be connected to receive a positive voltage, as for example 5 volts, while the adjacent fingers 54 and 54′ may be connected to ground. The fingers 42 and 42′ are connected through respective etch conductors 44 and 44′ to respective elevated feeder bus bars 46 and 46′ which extend along opposite sides of the board to feed the power to both ends of the alternate bus bars 22, 26 and 30. This feeding is accomplished through printed circuit conductors 48 and 48′ from the respective bus bars 46 and 46′ to the primary bus bar 22; through printed circuit conductors 50 and 50′ from bus bars 46 and 46′, respectively, to the primary bus bar 26; and through printed circuit conductors 52 and 52′ from respective bus bars 46 and 46′ to the ends of primary bus bar 30. By thus feeding power to both ends of the power bus bars 22, 26 and 30, a cantilever effect is avoided.

In a similar manner, the bus bars 24 and 28 are provided with common or ground potential at both ends thereof from fingers 54 and 54′ through respective printed circuit conductors 56 and 56′ and thence through respective feeder bus bars 58 and 58′ adjacent to the respective side edges 20 and 20′ of the board. Electrical connection from the feeder bus bars 58 and 58′ to the ends of primary bus bar 24 is accomplished through printed circuit conductors 60 and 60′, respectively, while electrical connection from the bus bars 58 and 58′ to the respective ends of primary bus bar 28 is accomplished through respective printed circuit conductors 62 and 62′.

By thus providing the grid arrangement of parallel primary bus bars alternately at power and ground potentials, four separate strips of the circuit board are provided between adjacent pairs of the primary bus bars which are arranged to deliver power to circuit components therebetween. Accordingly, the circuit components are arranged in four separate rows, a row 64 of components between the power bus 22 and ground or common bus 24, a row 66 of components between the ground or common bus 24 and the power bus 26, a row 68 of components between the power bus 26 and the ground or common bus 28, and a row 70 of circuit components between the ground or common bus 28 and the power bus 30. It is to be noted that each of these rows 64, 66, 68 and 70 of circuit components has conveniently available to each component therein the necessary power and ground conductors. To better illustrate this, FIGURES 4 and 5 illustrate the manner in which an integrated circuit unit 72 in the row 64 is electrically connected for power and ground to the respective primary bus bars 22 and 24. In this instance, power is provided to one of the pins of the integrated circuit 72 by etch conductor 74 leading from a tab 36 on the bus bar 22, the conductor 74 being located on the solder side 14 of the board. The ground connection is made between a tab 36 on the bus bar 24 and another pin of integrated circuit 72 through etch conductor 76 that is likewise located on the solder side of the board.

Figures 6, 7, 8:
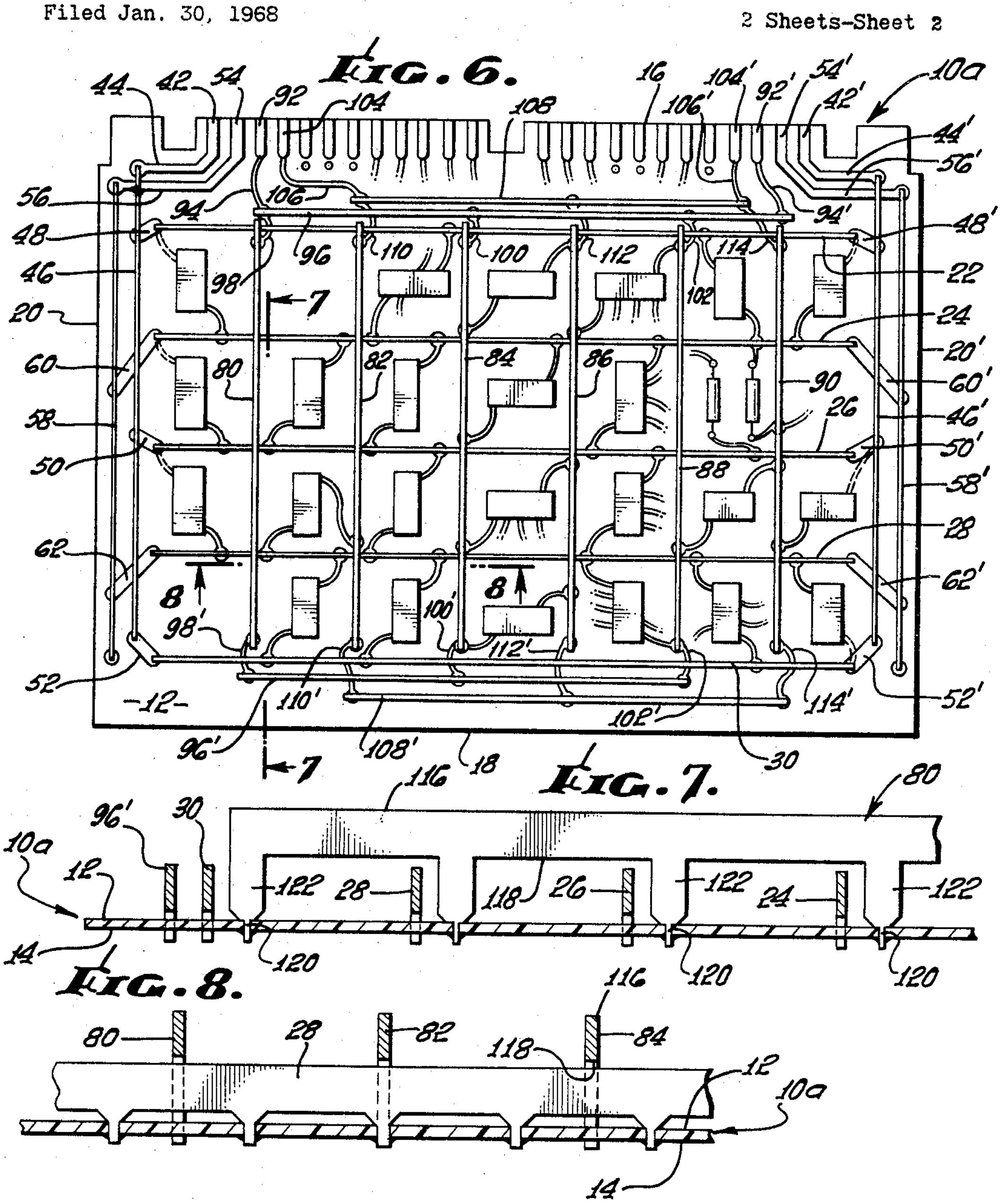
FIGURE 6 is a plan view similar to FIGURE 1, but with a second layer of elevated bus bars added thereto.
FIGURE 7 is an enlarged, fragmentary sectional view taken on the line 7—7 in FIGURE 6.
FIGURE 8 is an enlarged, fragmentary view taken on the line 8—8 in FIGURE 6.

FIGURES 6, 7 and 8 illustrate a printed circuit board or card **10*a* which bears a multi-layer elevated bus bar arrangement. For convenience the lower bus bar layer and its electrical distribution system is identical to that illustrated in FIGURES 1 to 5, with the parts thereof being numbered the same. Aside from the added bus bar layer and its electrical distribution system shown in FIGURES 6 to 8, the only difference between the circuit board 10*a* of FIGURES 6 to 8 and circuit board 10 of FIGURES 1 to 5 is a rearrangement of the circuit components so that individual circuit components or groups thereof will be located in the square or rectangular areas of the circuit board 10*a*** defined between the network of overlapping bus bars.

The added, upper layer of bus bars in FIGURES 6 to 8 includes a grid of uniformly spaced, parallel bus bars 80, 82, 84, 86, 88 and 90 which are oriented at right angles to the bus bars 22, 24, 26, 28 and 30, spaced further from the circuit board **10*a* than, and crossing over, the bus bars 22, 24, 26, 28 and 30. This second, upper layer of bus bars 80, 82, 84, 86, 88 and 90, while available for any distribution or collection purpose, typically would be employed to distribute to various circuit components over the board power of a different potential than that provided by the lower layer of bus bars. For example, while the alternate lower bus bars 22, 24, 26, 28 and 30 might be provided with a potential difference of 5 volts, with every other bar carrying either +5 volts or being at ground or common potential, the alternate upper bars 80, 82, 84, 86, 88 and 90 might be arranged to carry either +15 bolts or −15 volts, making a potential difference of 30 volts. For purposes of illustration only, and not of limitation, it will accordingly be assumed that the bars 80, 84 and 88 are to be provided with a potential of −15 volts, while the bars 82, 86 and 90 are to be provided with a potential of +15 volts. Distribution of the −15 volt potential to the bus bars 80, 84 and 88 may be accomplished by applying this potential to contact fingers 92 and 92′ at the connector edge 16 to the circuit board. Fingers 92 and 92′ are electrically connected through etch conductors 94 and 94′, respectively, to a feeder bus bar 96 which extends generally parallel to the bus bar 22 and may be arranged in the lower layer of bus bars insofar as its positioning is concerned. Electrical connection is effected from the feeder bus bar 96 to the three negative bus bars 80, 84 and 88 through respective etch conductors 98, 100 and 102. The other ends of bus bars 80, 84 and 88 are electrically tied together to complete the circuit by respective etch conductors 98, 100′ and 102′ which connect with a feeder bus bar 96′ which is arranged parallel to and generally at the same level as the lower bus bar 30**.

In similar fashion, the positive potential is applied to bus bars 82, 86 and 90 from connector fingers 104 and 104' through respective etch conductors 106 and 106', feeder bus 108 which is parallel to bus bar 96 and in the lower layer of bus bars, and thence through respective etch conductors 110, 112 and 114. This circuit is completed at the other ends of the bus bars 82, 86 and 90 through etch conductors 110', 112' and 114', respectively, which are connected to feeder bus bar 108' that is parallel to bus bar 96' and also in the lower level of bus bars.

As best seen in FIGURES 7 and 8, the upper bus bars are generally similar to the lower bus bars, each comprising an elongated, flat strip of conducting material, preferably a good metal conductor such as a suitable copper alloy, having parallel upper and lower edges 116 and 118, with tabs 120 extending downwardly from the lower edge 118 for both mechanical and electrical connection with the printed circuit board. The only difference between the upper bus bars and the lower bus bars is that in the upper bus bars the tabs 120 include elongated leg portions 122 which raise the elongated strip portions of the bus bars to a level spaced above the upper edges of the lower bus bars.

The upper layer of bus bars, like the lower set of bus bars, provides the board with greatly increased structural rigidity. The upper bus bars provide an entirely separate and additional power distribution system over and above that provided by the lower layer of bus bars, without in any way interfering with the distribution of power from the lower layer.

If desired, additional layers of bus bars can be provided, and the layers of bus bars may be positioned on either the component side of the board or the solder side of the board, or if desired, may be on both sides of the board. The high degree of versatility of the elevated bus bar system according to the present invention is believed well illustrated in the drawings, both by the manner in which a single layer of the bus bars can provide complete power distribution throughout the circuit board with a minimum of additional parts, and with a number of advantages over present power distribution systems as pointed out in detail hereinabove, and also by the relatively simple manner, as illustrated in FIGURES 6 to 8, in which a totally separate and additional power system can be applied by a second layer of bus bars without in any way changing or interfering with the first power system as provided by a first layer of the bus bars.

While the instant invention has been shown and described herein in what is conceived to be the most practical and preferred embodiment, it is recognized that departures may be made therefrom within the scope of the invention.

I claim:

1. A printed circuit board which comprises a generally flat sheet of insulation material having printed circuit means thereon, first and second grids of elongated, generally rigid bus bars extending generally parallel to the plane of said sheet in spaced relation to said sheet and to said printed circuit means, and a plurality of connector means spaced along the length of each bus bar mechanically connecting the respective bus bar to the sheet and electrically connecting the respective bus bar to said printed circuit means, each of said grids including a plurality of said bus bars arranged in spaced, generally parallel relationship with a generally uniform spacing from said sheet, said first and second grids of said bus bars being arranged in overlapping layers, said first and second grid layers being disposed at different elevations from said sheet, and the bus bars of said second grid being oriented generally at right angles with respect to the bus bars of said first grid.

2. A printed circuit board which comprises a generally flat sheet of insulation material having printed circuit means thereon, a grid of spaced, elongated, generally rigid bus bars extending generally parallel to each other and to the plane of said sheet in spaced relation to said sheet and to said printed circuit means, a plurality of connector members spaced along the length of each bus bar mechanically connecting the respective bus bar to the sheet and electrically connecting the respective bus bar to said printed circuit means, said grid of bus bars defining a plurality of substantially parallel strips of said circuit board arranged in side-by-side relationship with each strip being bounded at its opposite sides by a pair of said bus bars; and a plurality of substantially parallel rows of circuit components mounted on the respective said strips of the circuit board, individual ones of said circuit components in each of said rows thereof being electrically connected by portions of said printed circuits means to the respective pair of bus bars bounding the respective said strip upon which such individual circuit components are mounted.

3. A printed circuit board as defined in claim 2, which includes first and second electrical power input members, and conductor means including portions of said printed circuit means electrically connecting the respective said first and second power input members to alternate bus bars in said grid.

4. A printed circuit board as defined in claim 2, wherein individual said circuit components in each of said rows thereof are electrically connected by portions of said printed circuit means to the respective pair of bus bars bounding the respective said strip upon which such individual circuit components are mounted.

5. A printed circuit board as defined in claim 2, which includes first and second of said grids of said bus bars arranged in overlapping layers, said first and second grid layers being disposed at different elevations from said sheet, the bus bars of said second grid being oriented generally at right angles with respect to the bus bars of said first grid, said second grid of bus bars defining a plurality substantially parallel second trips of said circuit board arranged in side-by-side relationship generally at right angles to said first-mentioned strips, with each of said second strips being bounded at its opposite sides by a pair of said bus bars of said second grid thereof, said circuit components being arranged in rows on both said first-mentioned strips and said second strips.

6. A printed circuit board as defined in claim 2, wherein some of said circuit components in each row thereof comprise integrated circuit units.

7. A printed circuit board as defined in claim 2, which includes substantially parallel pair of feeder bus bars connected to said sheet and arranged generally at right angles with respect to said grid bus bars, said feeder bus bars each being spaced from an end of said grid of bus bars, and the respective said feeder bus bars electrically connected by portions of said printed circuit means to alternate bus bars in said grid.

8. A printed circuit board as defined in claim 2, wherein both of said feeder bus bars are located adjacent the same end of said grid bus bars.

9. A printed circuit board as defined in claim 8, which includes a pair of said feeder bus bars adjacent each end of said grid bus bars.

References Cited

UNITED STATES PATENTS

| | | |
|---|---|---|
| 3,162,788 | 12/1964 | Allen et al. |
| 3,393,449 | 7/1968 | Garcia. |

DARRELL L. CLAY, Primary Examiner

U.S. Cl. X.R.

174—68.5